United States Patent [19]

Hester et al.

[11] Patent Number: 4,843,342

[45] Date of Patent: Jun. 27, 1989

[54] DIFFERENTIAL AMPLIFIER WITH INPUT BIAS CURRENT CANCELLATION

[75] Inventors: Richard E. Hester; Tuan V. Ngo, both of Eden Prairie, Minn.

[73] Assignee: VTC Incorporated, Bloomington, Minn.

[21] Appl. No.: 130,526

[22] Filed: Dec. 9, 1987

[51] Int. Cl.⁴ .............................................. H03F 3/45
[52] U.S. Cl. ..................................... 330/257; 330/261
[58] Field of Search ......................... 330/257, 258, 261

[56] References Cited

U.S. PATENT DOCUMENTS 4,575,685 3/1986 Dobkin et al. ....................... 330/261

OTHER PUBLICATIONS

Article entitled "Precision Op Amp Serves Host of Design Needs", *Electronic Design*, pp. 95–100, (Sep. 1, 1983).

*Primary Examiner*—James B. Mullins
*Attorney, Agent, or Firm*—Kinney & Lange

[57] ABSTRACT

A bias current cancellation circuit provides current to the bases of a pair of transistors forming a differential amplifier. A transistor of matched characteristics to the differential amplifier pair is operated so that its base current replicates the base currents of the differential transistor pair. This replicated base current is inverted by a current mirror which is connected to the bases of the differential transistional pair. A second order cancellation error caused by base current differences in the current mirror is cancelled by a feedback circuit so that only the base current of the matching transistor affects the currents supplied to differential amplifier.

16 Claims, 1 Drawing Sheet

DIFFERENTIAL AMPLIFIER WITH INPUT BIAS CURRENT CANCELLATION

BACKGROUND OF THE INVENTION

1. Field of the Invention

The present invention relates to electronic amplifier circuits. In particular, the present invention relates to an improved input bias current cancellation circuit which cancels out first and second order errors while achieving a wide input voltage range.

2. Description of the Prior Art

Bias current cancellation circuits have been used in the past in amplifier circuits, particularly operational amplifiers. These circuits usually involve monitoring the input current to the differential amplifier NPN transistors, inverting the input current with PNP current mirrors, and injecting the inverted current back into the inputs of the differential amplifier.

The prior art bias current cancellation circuits have, in general, been successful in cancelling first order bias current errors. The biggest contributor to cancellation errors in these circuits is the second order error caused by base current difference in the current mirror PNP transistors. The base current difference is due to the low beta of the PNP transistors.

Another shortcoming of prior art bias current cancellation circuit has been the relatively large amount of head room consumed in order to provide input bias current cancellation. Prior art input bias current cancellation circuits typically limit the input voltage swing to within three to four volts of the power supply rails. Operational amplifiers using input bias current cancellation circuits have typically used ±15 volt supply voltages. In order to provide an operational amplifier which operates at much lower supply voltages (such as ±5 volts), there is a need for input bias cancellation which does not consume such a large amount of head room while still providing the cancellation.

THE SUMMARY OF THE INVENTION

The input bias cancellation circuit of the present invention monitors current flowing through the current source connected to a differential amplifier, replicates base currents of the differential amplifier transistors in a matched transistor, inverts the base current with a current mirror circuit, and injects that current back into the inputs of the differential amplifier.

The bias current cancellation circuit also includes a second order cancellation circuit which compensates for base currents of the current mirror transistors which inject current to the inputs, so that only the base current of the matched transistor affects the injected current to the inputs of the differential amplifier.

BRIEF DESCRIPTION OF THE DRAWINGS

The FIGURE shows an electrical schematic diagram of an input stage of an operational amplifier having a differential amplifier and the bias current cancellation circuit of the present invention.

DETAILED DESCRIPTION OF THE PREFERRED EMBODIMENTS

Figure 1:
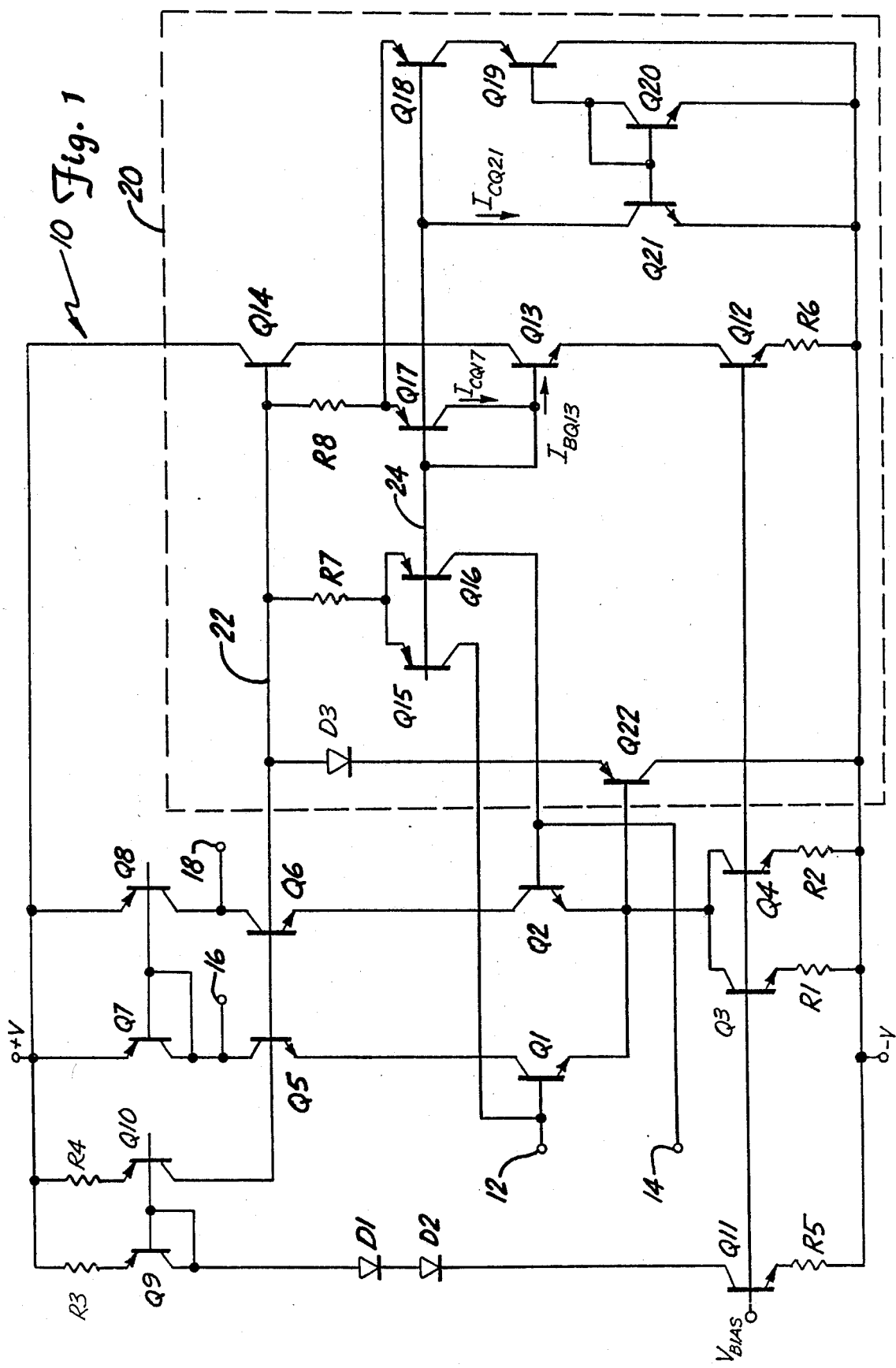

Amplifier circuit 10, which is a part of a bipolar transistor operational amplifier, includes inputs 12 and 14 for receiving an input voltage $V_{IN}$ and outputs 16 and 18 for providing an output voltage $V_{OUT}$. NPN transistors Q1 and Q2 form a differential amplifier. The base of transistor Q1 is connected to input 12, while the base of transistor Q2 is connected to input 14. The emitters of transistors Q1 and Q2 are connected together to a current source formed by NPN transistors Q3 and Q4 and resistors R1 and R2. Current source resistors R1 and R2 are connected between the emitters of transistors Q3 and Q4, respectively, and negative supply voltage $-V$. The bases of transistors Q3 and Q4 are connected together to bias voltage $V_{BIAS}$.

The collectors of transistors Q1 and Q2 are connected to a cascode stage formed by NPN transistors Q5 and Q6. PNP transistors Q7 and Q8 are connected to the collectors of Q5 and Q6, respectively, to provide the load for the cascode stage. Output 16 is connected to the collectors of transistors Q5 and Q7, and output 18 is connected to the collectors of transistors Q6 and Q8. The emitters of Q7 and Q8 are connected to positive power supply $+V$.

PNP transistors Q9 and Q10 and resistors R3 and R4 form a current mirror circuit which provides current to the bases of cascode stage transistors Q5 and Q6. The current being mirrored by the current mirror of transistors Q9 and Q10 is set up by transistor Q11 and resistor R5. The base of transistor Q11 is connected to the bases of current source transistors Q5 and Q6 to receive the bias voltage $V_{BIAS}$. The emitter of transistors Q11 is connected through resistor R5 to negative supply voltage $-V$. The collector of transistor Q11 is connected through protection diodes D1 and D2 to the collector and base of transistor Q9. The current supplied to the bases of Q5 and Q6, therefore, is related to the current flowing through the current source formed by transistors Q3 and Q4, and resistors R1 and R2.

Input bias cancellation circuit 20 of the present invention is formed by transistors Q12-Q22, resistors R6, R7, and R8, and diode D3.

NPN transistor Q12 and resistor R6 are connected in a current mirror relationship with transistors Q3 and Q4. The size of transistors Q12 and resistor R6 is selected so that the collector current of transistor Q12 is equal to one half of the combined collector current of transistors Q3 and Q4.

NPN transistor Q13 is matched to differential amplifier NPN transistors Q1 and Q2 and is connected to Q12 so that the base current of Q13 ($I_{BQ13}$) is equal to the base currents $I_{BQ1}$ and $I_{BQ2}$ of Q1 and Q2, respectively. The collector current of transistor Q13 is provided by NPN transistor Q14, which has its base connected to node 22, and therefore to the bases of cascode stage transistors Q5 and Q6. The base of transistor Q13 is connected to node 24.

PNP transistors Q15 and Q16 have their collectors connected to the bases of transistors Q1 and Q2, respectively. The emitters of transistors Q15 and Q16 are connected together through resistor R7 to node 22. The bases of transistors Q15 and Q16 are connected together to node 24.

PNP transistors Q17 and Q18 have their bases connected to node 24. The emitters of Q17 and Q18 are connected through resistor R8 to node 22. The collector of Q17 is also connected to node 24.

Transistors Q15 and Q16 are, therefore, connected in a current mirror relationship to transistor Q17. The collector currents of transistors Q15 and Q16 (which are supplied to the bases of transistors Q1 and Q2 to provide input bias current cancellation) mirror the collector current $I_{CQ17}$ of the transistor Q17. In cancellation circuit 20 of the present invention, $I_{CQ17}$ is maintained equal to the base current $I_{BQ13}$ of transistor Q13.

Transistors Q18–Q21 provide a second order bias cancellation by ensuring that $I_{CQ17}=I_{BQ13}$. This is achieved by making the collector current $I_{CQ21}$ of NPN transistor Q21 equal to the sum of the base currents of transistors Q15, Q16, Q17, and Q18. The collector current of transistor Q18, which is equal to the collector current $I_{CQ17}$ of transistor Q17, is provided to the emitter of PNP transistor Q19. The base current of transistor Q19 is mirrored by the current mirror formed by NPN transistors Q20 and Q21 so that the collector current $I_{CQ21}$ of transistor Q21 is a function of the base current of PNP transistor Q19. The transistors, particularly Q19, are scaled so that $I_{CQ21}=I_{BQ15}+I_{BQ16}+I_{BQ17}+I_{BQ18}$. Since the only other current flowing into node 24 is $I_{CQ17}$ and the only other current flowing out of node 24 is $I_{BQ13}$, then $I_{CQ17}=I_{BQ13}$ and the effects of the base currents of transistors Q15, Q16 and Q17 on the current supplied to transistors Q1 and Q2 are negated.

PNP transistor 22 and diode D3 ensure that the input bias current cancellation will occur despite variations in the common node voltage at inputs 12 and 14. The base of transistor Q22 is connected to the emitters of transistors Q1 and Q2. Thus, the base of transistors Q22 is one $V_{BE}$ below inputs 12 and 14. In turn, the emitter of transistor Q22 is one $V_{BE}$ above the base of transistor Q22. Diode De makes the voltage at node 22 two $V_{BE}$ above the emitters of transistors Q1 and Q2 or one $V_{BE}$ above inputs 12 and 14. The amount of current dropped across resistors R7 and R8 is relatively small, and therefore the voltages at the emitters of transistors Q15 and Q16 and at the emitters of transistors Q17 and Q18 are nearly equal to the voltage at node 22. The voltage at node 24 is one $V_{BE}$ below the voltage at node 22, and therefore is approximately equal to the common mode voltage at inputs 12 and 14. As the common mode voltage at inputs 12 and 14 shifts, the voltages at nodes 22 and 24 also shift so that changes in the common node voltage will not affect operation of input bias cancellation circuit 20.

In a preferred embodiment of the present invention, resistors R7 and R8 are trimmable to provide further precision in cancellation of input bias current.

With the present invention, both first order and second order bias current cancellation is achieved. In addition, the input bias current cancellation circuit 20 of the present invention allows voltage swings of about 1.5 volts of the power supply rails. As a result, input bias current cancellation is achieved without significant sacrifices in head room, as has been the case with prior art input bias current cancellation circuits.

Although the present invention has been described with reference to preferred embodiments, workers skilled in the art will recognize that changes may be made in form and detail without departing from the spirit and scope of the invention.

What is claimed is:

1. An amplifier with input bias current cancellation, the amplifier comprising:
   first and second inputs;
   first and second NPN transistors having emitters connected together, and bases connected to the first and second inputs, respectively;
   first and second PNP transistors having bases connected together, and having collectors connected to the bases of the first and second NPN transistors respectively;
   a third NPN transistor having an emitter, a collector, and a base;
   current source means connected to the collectors of the first and second NPN transistors;
   a third PNP transistor having a base, an emitter, and a collector, the base and collector of the third PNP transistor being connected together and connected to the bases of the first and second PNP transistors and to the base of the third NPN transistor, the third PNP transistor being connected to the first and second PNP transistors so that collector currents of the first and second PNP transistors mirror collector current of the third PNP transistor;
   a fourth PNP transistor having an emitter, a base and a collector, the emitter being connected to an emitter of the third PNP transistor and the base being connected to the bases of each of the first, second and third PNP transistors; the fourth PNP transistor providing a collector current that mirrors collector currents of the first and second PNP transistors; and
   means connected to the collector and the base of the fourth PNP transistor for providing a correction current to cancel effects of base currents of the first, second, third and fourth PNP transistors so that the collector current of the third PNP transistor is equal to the base current of the third NPN transistor.

2. The amplifier of claim 1 wherein the means for providing a correction current comprises:
   controlled current sink means having a control current input terminal connected to the collector of the fourth PNP transistor and having a current sink terminal connected to the bases of the first, second, third and fourth PNP transistors;
   the controlled current sink means operating so that current drawn by the current sink terminal is a function of current drawn by the control current input terminal 3. The amplifier of claim 1 and further comprising:
   fourth, fifth and sixth NPN transistors having bases connected together, and having emitters connected to collectors of the first, second and third NPN transistors, respectively.

4. The amplifier of claim 3 and further comprising:
   first resistance means connected between emitters of the first and second PNP transistors and the bases of the fourth, fifth and sixth NPN transistors; and
   second resistance means connected between an emitter of the third PNP transistor and the bases of the fourth, fifth and sixth NPN transistors.

5. The amplifier of claim 4 and further comprising:
   means connected between the emitters of the first and second NPN transistors and the bases of the fourth, fifth and sixth NPN transistors for establishing a selected voltage therebetween.

6. The amplifier of claim 5 wherein the selected voltage is approximately two $V_{BE}$.

7. The amplifier of claim 1 wherein the means for providing a correction current comprises:
   controlled current sink means having a control current input terminal connected to the collector of the fourth PNP transistor and having a current sink terminal connected to the bases of the first, second, third and fourth PNP transistors;
   the controlled current sink means operating so that current drawn by the current sink terminal is a function of current drawn by the control current input terminal.

8. An amplifier with input bias current cancellation, the amplifier comprising:
   first and second inputs;
   a differential amplifier connected to the first and second inputs, the differential amplifier including first and second NPN transistors and current source means connected to the first and second NPN transistors;
   a third NPN transistor having a base, a collector and an emitter;
   first current mirror means connected to the differential amplifier and to the third NPN transistor for establishing a base current of the third NPN transistor which is a function of base currents of the first and second NPN transistors;
   second current mirror means including first, second and third PNP transistors, the first PNP and second PNP transistors having collectors connected to bases of the first and second NPN transistors, and the third PNP transistor having a collector and a base connected together and connected to the base of the third NPN transistor, the base of the first PNP transistor and the base of the second PNP transistor; and
   means connected to the bases of the first, second and third PNP transistors for providing a correction current to cancel effects of base currents of the first, second, and third PNP transistors so that the collector current of the third PNP transistor is equal to the base current of the third NPN transistor.

9. The amplifier of claim 8 wherein the means for providing a correction current comprises:
   a fourth PNP transistor connected to at least one of first, second and third PNP transistors to provide a mirrored collector current which is a function of the collector current of one of the first, second and third PNP transistors;
   a fifth PNP transistor connected to the fourth PNP transistor to receive the mirrored collector current, the fifth PNP transistor providing a base current which is a function of the base currents of the first, second and third PNP transistors; and
   current mirror means connected to the bases of the first, second and third PNP transistors for mirroring the base current of the fifth PNP transistor as the correction current.

10. The amplifier of claim 8 and further comprising:
    fourth, fifth and sixth NPN transistors having bases connected together, and having emitters connected to collectors of the first, second and third NPN transistors, respectively.

11. The amplifier of claim 10 and further comprising:
    first resistance means connected between emitters of the first and second PNP transistors and the bases of the fourth, fifth and sixth NPN transistors; and
    second resistance means connected between an emitter of the third PNP transistor and the bases of the fourth, fifth and sixth NPN transistors.

12. The amplifier of claim 11 and further comprising:
    means connected between the emitters of the first and second NPN transistors and the bases of the fourth, fifth and sixth NPN transistors for establishing a selected voltage therebetween.

13. The amplifier of claim 12 wherein the selected voltage is approximately two $V_{BE}$.

14. The amplifier of claim 8 wherein the means for providing a correction current comprises:
    a fourth PNP transistor having an emitter connected to the emitter of the third PNP transistor and a base connected to the bases of the first and second PNP transistors;
    controlled current sink means having a control current input terminal and a current sink terminal; the controlled current sink means operating so that the current drawn by the current sink terminal is a function of the current drain by the control current input terminal; and the controlled current sink means having the control current input terminal connected to the collector of the fourth PNP transistor and a current sink terminal connected to the bases of the first, second, third and fourth PNP transistors.

15. An amplifier with input bias current cancellation, the amplifier comprising:
    first and second inputs;
    first and second NPN transistors having emitters connected together, and bases connected to the first and second inputs, respectively;
    first and second PNP transistors having bases connected together, and having collectors connected to the bases of the first and second NPN transistors respectively;
    a third NPN transistor having an emitter, a collector, and a base;
    a third PNP transistor having a base and collector connected together and to the bases of the first and second PNP transistors and to the base of the third NPN transistor, the third PNP transistor being connected to the first and second PNP transistors so that collector currents of the first and second PNP transistors mirror the collector current of the third PNP transistor;
    fourth, fifth and sixth NPN transistors having bases connected together, and having emitters connected to collectors of the first, second, and third NPN transistors, respectively; and
    means connected to the bases of the first, second and third PNP transistors for providing a correction current to cancel effects of base currents of the first, second, and third PNP transistors so that the collector current of the third PNP transistor is equal to the base current of the third NPN transistor.

16. The amplifier of claim 15 and further comprising:
    a fourth PNP transistor having an emitter, a base and a collector, the emitter being connected to an emitter of the third PNP transistor and the base being connected to the bases of each of the first, second and third PNP transistors; the fourth PNP transistor providing a collector current that mirrors collector currents of the first second PNP transistors.

* * * * *